United States Patent
Hinterscher

(10) Patent No.: US 6,919,751 B2
(45) Date of Patent: Jul. 19, 2005

(54) DYNAMIC RECEIVER CLAMP THAT IS ENABLED DURING PERIODS IN WHICH OVERSHOOT IS LIKELY

(75) Inventor: Eugene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 10/676,238

(22) Filed: Oct. 1, 2003

(65) Prior Publication Data

US 2005/0073348 A1 Apr. 7, 2005

(51) Int. Cl.[7] ............................................. H03K 5/08
(52) U.S. Cl. ...................... 327/309; 327/321; 361/91.1
(58) Field of Search ................................ 327/320, 321, 327/309, 310, 312, 314; 361/91.1, 91.5

(56) References Cited

U.S. PATENT DOCUMENTS

| 4,382,198 A | * | 5/1983 | Ishijima et al. ............. 327/309 |
| 4,590,394 A | * | 5/1986 | Pace ........................... 327/318 |
| 5,357,156 A | * | 10/1994 | Herrington ................... 327/310 |
| 5,708,550 A | * | 1/1998 | Avery ............................ 361/56 |
| 6,097,237 A | * | 8/2000 | Singh ........................... 327/389 |
| 6,396,315 B1 | | 5/2002 | Morris ......................... 327/112 |

* cited by examiner

Primary Examiner—Tuan T. Lam
Assistant Examiner—Hiep Nguyen
(74) Attorney, Agent, or Firm—J. Dennis Moore; W. James Brady, III; Frederick J. Telecky, Jr.

(57) ABSTRACT

A dynamic clamp 200 selectively clamps overshoot on a signal line 100 when overshoot is likely, while not clamping the received signal at times when overshoot is not likely encountered. A Driver Disable signal 102 disables the output of an output driver 110 so that it presents a high impedance to the signal line 100. An activation element 310 asserts a Clamp Enable signal 311, for example, in response to a transition of the received signal that occurs, for example, during a period in which a corresponding Driver Disable signal 102 is asserted. A deactivation element 320 asserts a Clamp Disable signal 321, for example, a predetermined deactivation delay period after the Clamp Enable signal 311 is asserted. A clamping portion 330 selectively clamps the received signal 100 beginning with the assertion of the Clamp Enable signal and ending with the assertion of the Clamp Disable signal.

20 Claims, 4 Drawing Sheets

DYNAMIC RECEIVER CLAMP THAT IS ENABLED DURING PERIODS IN WHICH OVERSHOOT IS LIKELY

BACKGROUND OF THE INVENTION

1. Field of the Invention

The invention generally relates to clamp circuits. More particularly, the invention relates clamp circuits especially suitable for use in backplane applications in which a clamping function is enabled only during time periods in which overshoot is likely to be encountered, and in which other requirements (such as overvoltage tolerance and $I_{off}$ current requirements) are not sacrificed.

2. Related Art

FIG. 1 depicts a conventional circuit in which an output driver 110 drives a signal line 100 under control of a Driver Disable signal 102. A receiver 120 is connected to signal line 100. The arrangement shown in FIG. 1 may be found on each card 130 of plural cards that are inserted into a backplane, in which respective output drivers 110 may contend for control of the common signal line 100. Driver Disable signal 102 ensures that driver 110 does not attempt to drive signal line 100 when another element (not shown) has permission to drive the signal line. In this manner, contentions for control of the signal line 100 are resolved.

Especially in a backplane environment, undesirable transmission line effects such as overshoot and ringing may occur. Such undesirable effects cause received signals to take on values that may cause data errors or even circuit damage. For example, FIG. 7A shows a waveform of a conventional circuit in which a primary overshoot to 5.6 volts and a intermediate descent to 2.1 volts are experienced before a secondary overshoot to 4.2 volts. In the circuit using the technology giving rise to the illustrated diagram, the ideal steady state voltage level is 3.6 volts. It is readily appreciated that the overshoot in FIG. 7A is unacceptable for many applications, as is the intermediate descent to barely half the ideal steady state voltage level.

Thus, it is desirable that the primary overshoot, intermediate descent, and secondary overshoot be reduced in order to approach to the ideal steady state voltage more quickly and stably remain within an acceptable range around the desired steady stage voltage.

However, it is also desirable not to interfere with a signal any more than necessary to minimize transmission line effects. Accordingly, there is a need in the art to remove overshoot and related problems while minimally affecting the shape of the received waveform.

Furthermore, it is desirable that any arrangement that combats transmission line effects not sacrifice other circuit specifications. Such specifications include, for example, overvoltage tolerance and off current specifications. As understood herein, an "overvoltage tolerance specification" requires that when the received waveform takes on a voltage greater than the receiver supply voltage VCC, no circuit damage occurs and no unwanted current interferes with the received signal line 100 by passing between it and the supply voltage VCC. An "$I_{off}$ current specification" requires that if VCC=0 (that is, if the receiver is not powered) and if a non-zero voltage is applied to the receiver's input/output (I/O) port, then no circuit damage occurs and no unwanted leakage current is drawn from the signal line 100 that would affect the waveform's shape.

Clamping circuits, in general, are known in the art. For example, U.S. Pat. No. 6,396,315 (Morris) discloses clamping an output terminal of a buffer only when a buffered device is powered on, but presenting a high impedance when the buffered device is not powered on. In this manner, when an electronic device having the buffer enters an inoperable state due to device failure or power loss, yet remains physically connected to other devices, the inoperable device will not affect operation of other devices. However, Morris' arrangement does not appear to address the problem of input voltage clamping to reduce overshoot and related problems that are discussed above.

Accordingly, there is a need in the art for an arrangement that reduces overshoot and related transmission line effects while minimally affecting the waveform at times when such effects are less likely, and not sacrificing other circuit specifications such as overvoltage tolerance and $I_{off}$ current specifications.

SUMMARY

Accordingly, there is provided an arrangement that provides protection against overshoot and related problems while not affecting the received waveform at times when such problems are not likely encountered.

Further, additional features of the arrangement ensure that other circuit specifications (such as, for example, overvoltage tolerance and $I_{off}$ current specifications) are not compromised.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which.

DETAILED DESCRIPTION

Figure 1:
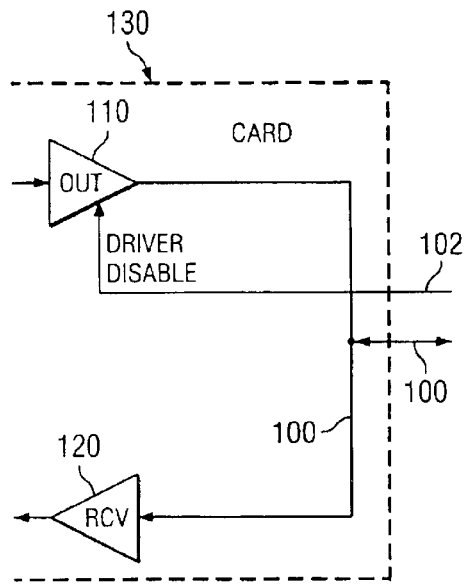
FIG. 1 illustrates a conventional driver/receiver circuit in which undesirable transmission line effects such as overshoot and ringing may occur on a signal line 100.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used to interpret the claims.

Moreover, features and procedures whose implementations are well known to those skilled in the art are omitted for brevity. For example, design, selection, and implementation of basic electronic circuit elements such as signal level shifters, buffers, logic elements, current and voltage sources, diodes, bipolar transistors, metal oxide semiconductor field effect transistors (MOSFETs), delay elements, and the like, lie within the ability of those skilled in the art, and accordingly any detailed discussion thereof may be omitted.

Figure 2:
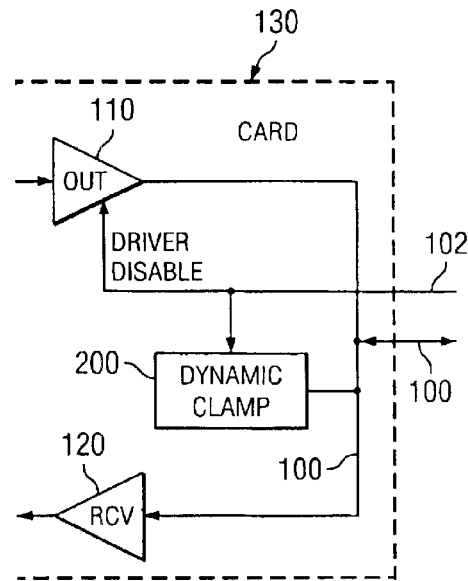
FIG. 2 illustrates an embodiment of a driver/receiver circuit that includes a dynamic clamp 200 that reduces the undesirable transmission line effects on signal line 100.

FIG. 2 illustrates an embodiment of a driver/receiver circuit that includes a dynamic clamp 200 that reduces undesirable transmission line effects on signal line 100. Dynamic clamp 200 clamps the signal line 100 during time periods in which overshoot is likely. In one embodiment, dynamic clamp 200 uses the Driver Disable signal 102 and transitions of the signal on signal line 100 to determine the time periods in which a clamping function is enabled.

The Driver Disable signal 102 may be the same as that noted with reference to FIG. 1, and thus may be generated in accordance with principles of conventional circuits.

The Driver Disable signal is understood by those skilled in the art to enable or disable the output of output driver 110 to avoid contention on signal line 100.

The signal on signal line 100 may be generated on a different card 130 from that on which receiver 120 is situated, and may pass through a backplane and various connectors. Accordingly, substantial undesirable transmission line effects would be present on signal line 100 were it not for dynamic clamp 200.

Figure 3:
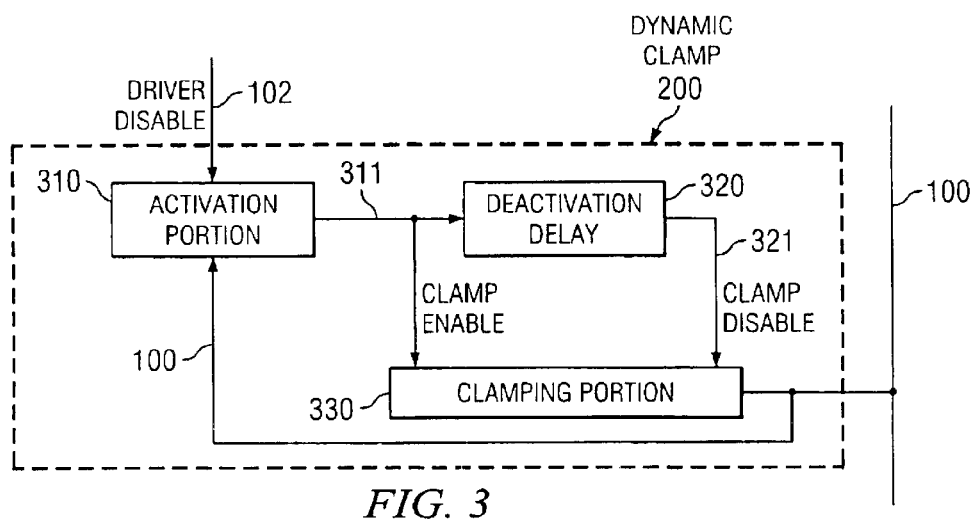
FIG. 3 is a simplified diagram that illustrates one embodiment of dynamic clamp 200 that enables a clamping function during periods in which the undesirable transmission line effects are likely to arise.

FIG. 3 is a simplified diagram that illustrates one embodiment of dynamic clamp 200. The FIG. 3 embodiment involves activation of a clamping function during periods in which undesirable transmission line effects, such as overshoot and related problems, are likely to arise. In one embodiment, such periods are immediately after a signal on signal line 100, originating from a driver other than output driver 110 on the same card 130 as the receiver 120, positively transitions (that is, transitions away from ground level toward a voltage supply level).

Referring to FIG. 3, the Driver Disable signal 102 and the received signal on signal line 100 are input to activation portion 310. Activation portion 310 provides a Clamp Enable signal on path 311 to deactivation delay 320 and to clamping portion 330.

In one embodiment, the Clamp Enable signal becomes active a predetermined time after a first positive transition of the received signal provided the Driver Disable signal has disabled the output driver 110 on the same card 130. The Clamp Enable signal thus determines when the clamping portion 330 becomes enabled to clamp signal line 100.

Deactivation delay 320 uses the Clamp Enable signal 311 as a time base to provide a Clamp Disable signal 321 a predetermined time period after the Clamp Enable signal 311 is asserted. The Clamp Disable signal 321 determines when the clamping portion 330 is disabled from clamping signal line 100.

The durations of any delay within activation portion 310, and deactivation delay 320, are readily determined by those skilled in the art in accordance with the particular application. For example, circuits operating at higher frequencies will have proportionately shorter activation and deactivation delays.

Figure 4:
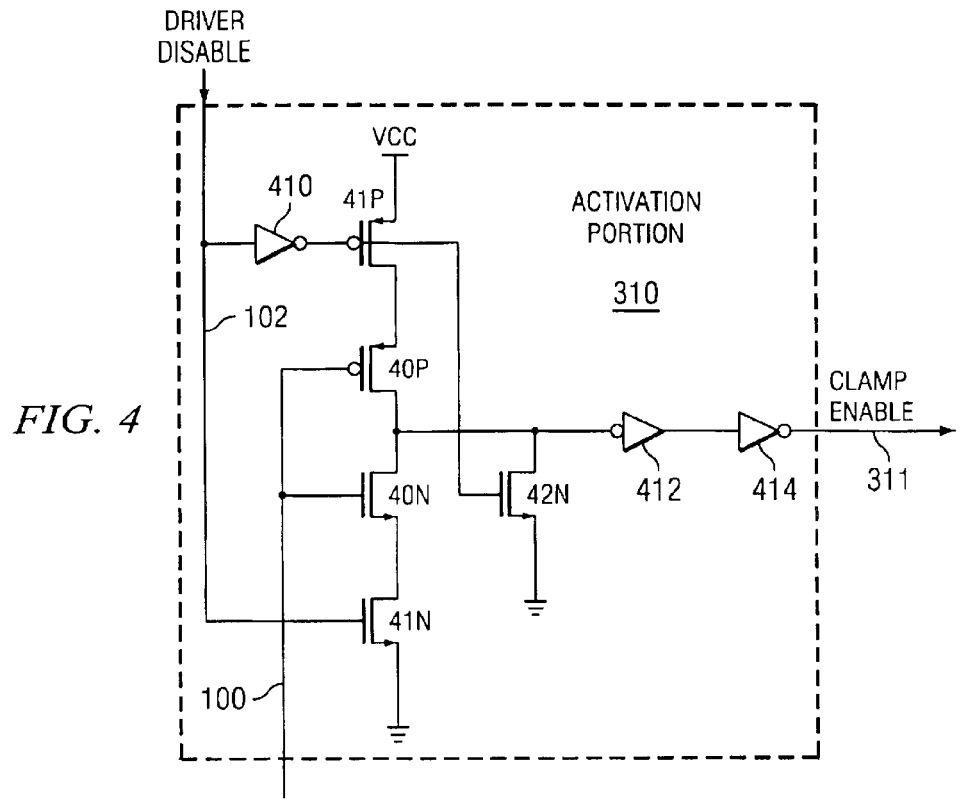
FIG. 4 illustrates an embodiment of activation portion 310 (FIG. 3), which determines the time when the clamping function becomes enabled.
Figure 5:
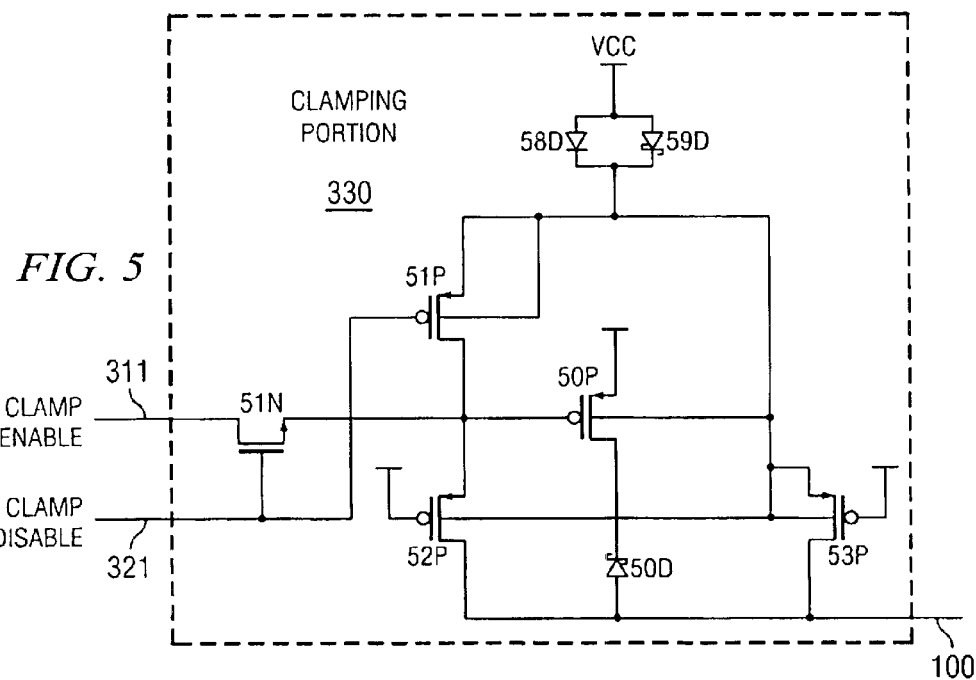
FIG. 5 illustrates an embodiment of clamping portion 330 (FIG. 3) having a clamping function that is enabled and disabled at controlled times so as to clamp overshoot on signal line 100.

FIGS. 4 and 5 respectively illustrate embodiments of activation portion 310 and clamping portion 330.

FIG. 4 illustrates one embodiment of activation portion 310 (FIG. 3), which determines the time when the clamping function of clamping portion 330 becomes enabled.

Driver Disable signal 102 is input to an inverter 410, which in turn drives the gate of an p-channel MOSFET 41P and the gate of an n-channel MOSFET 42N. Driver Disable signal 102 directly drives the gate of an n-channel MOSFET 41N. Together, MOSFETs 41P, 41N function as a switch whose lower MOSFET 41N conducts only when the Driver Disable signal 102 is high.

Signal line 100 drives the gates of p-channel MOSFET 40P and n-channel MOSFET 40N. Together, MOSFETs 40P, 40N function as a switch whose lower MOSFET 40N conducts only when the received signal on signal line 100 rises above a threshold voltage.

The node between MOSFETs 40P, 40N drives a delay element, which may be implemented as one or more inverters or buffers. In the FIG. 4 embodiment, the delay element may include plural (for example, two) series-connected inverters 412, 414. The output of inverter 414 constitutes the Clamp Enable signal 311 (FIG. 3). Inverters 412 and 414 ensure that a clamp control device (such as p-channel MOSFET 50P in FIG. 5, described below) is turned on at a desired time to enable the clamping function of clamping portion 330.

When Driver Disable signal 102 is low (indicating that FIG. 2 output driver 110 is enabled), n-channel MOSFET 42N is turned on, thus preventing the input of inverter 412 from floating and preventing improper assertions of Clamp Enable signal 311.

Collectively, the stacked devices 41P, 40P, 40N, 41N perform an AND function for which the Driver Disable signal 102 and the signal line 100 are inputs. In the illustrated embodiment, the desired time to turn on the clamping (see FIG. 7C) is when a low-to-high transition occurs on signal line 100 during a period in which the Driver Disable signal is high.

Referring especially to FIGS. 2 and 4, when output driver 110 is used as a driver of signal line 100 in a backplane environment, the dynamic clamp 200 is disabled. When disabled, dynamic clamp 200 does not interfere with the output driver or signal line 100. To disable the dynamic clamp 200, Driver Disable signal 102 turns off any input to the dynamic clamp 200 by turning off MOSFETs 41P and 41N (FIG. 4).

Conversely, when output driver 110 goes into a high-impedance state and receiver 120 should receive the signal on signal line 100 from a source other than driver 110, the clamping circuit 200 becomes functional: Driver Disable signal 102 turns on devices 41P, 41N, enabling the rising edge of an input signal on signal line 100 to reach through devices 40P, 40N to cause the Clamp Enable signal 311 to be asserted.

Deactivation delay 320 (FIG. 3) may simply be a set of one or more series-connected inverters or buffers that collectively achieve a desired time delay. In particular, deactivation delay 320 may be implemented in a manner similar to FIG. 4 elements 412, 414. Deactivation delay 320 provides the Clamp Disable signal 321 that causes p-channel MOSFET 50P (FIG. 5, described below) to be turned off, terminating the period during which clamping portion 330 is enabled.

More specifically, in the illustrated embodiment, deactivation delay 320 determines the amount of time that the signal at the base of MOSFET 50P (FIG. 5, described below) stays low after a low-to-high transition of a received signal on signal line 100 triggers Clamp Enable signal 311. The timing diagram in FIG. 7C illustrates the voltage at the gate of MOSFET 50P going high, being driven through device 51P (FIG. 5) whose gate goes low in response to Clamp Disable signal 321.

The duration of the deactivation delay may be chosen and implemented by those skilled in the art in accordance with characteristics of the particular application, taking into account such characteristics as the frequency of received signals, the likely duration of any overshoot, and so forth. Accordingly, the internal details of deactivation delay 320 need not be separately shown or further described.

FIG. 5 illustrates an embodiment of clamping portion 330 that is enabled and disabled at controlled times so as to clamp overshoot on signal line 100 at times when overshoot and related transmission line problems are likely to occur.

Referring to FIG. 5, a Schottky diode 50D selectively clamps signal line 100 to a value no higher than the supply voltage VCC (plus the diode's forward junction voltage). Diode 50D is connected in series with a clamp control device (here, p-channel MOSFET 50P) between signal line 100 and VCC. When the control input to the gate of MOSFET 50P (see timing diagram of FIG. 7C) falls below VCC by an amount sufficient to turn on MOSFET SOP. The low gate input makes MOSFET 50P conduct, so as to electrically connect diode 50D to VCC and thus enable the clamping function.

Accordingly, in the FIG. 5 embodiment, clamping occurs only when MOSFET 50P is on and the input voltage exceeds VCC. By operation of activation portion 310 and deactivation delay 320 (FIGS. 3, 4), MOSFET 50P is on, only for a certain time period beginning after the input signal on signal line 100 positively transitions (qualified by Driver Disable signal 102) and ending a deactivation time delay period later. In this manner, the dynamic clamp 200 directly affects the received signal on signal line 100 only during periods when overshoot is likely. In this embodiment, those periods are immediately after a positive transition in an input signal originating from a driver other than output driver 110 that is on the same card 130 as the receiver 120. Of course, periods other than this particular period are contemplated for enabling clamping portion 330.

Control of the elements in FIG. 5 is understood in greater detail as follows.

Clamp Enable signal 311 from activation portion 310 is input to the drain of an n-channel MOSFET 51N. In the illustrated embodiment, the Clamp Enable signal 311 is active low, so that when the clamping function is to be enabled, the drain, and by implication the source, of MOSFET 51N is pulled low. A low signal from the source of MOSFET 51N turns on p-channel MOSFET 50P, electrically connecting clamping diode 50D to VCC and enabling the clamping function.

The clamping function is disabled when the active-low Clamp Disable signal 321 transitions from high to low. Clamp Disable signal 321 drives the gate of MOSFET 51N, attempting to turn it off. Meanwhile, however, Clamp Disable signal 321 also drives the gate of p-channel MOSFET 51P, turning it on (conductive), connecting the gate of MOSFET 50P and the source of MOSFET 51N to VCC. Significantly, when MOSFET 50P is thus turned off, it no longer connects clamping diode 50D to VCC and the clamping function is disabled. Also, MOSFET 51N is turned off by its source's connection to VCC, blocking any attempt by Clamp Enable signal 311 to turn on MOSFET 50P. In this manner, Clamp Disable signal 321 overrides Clamp Enable signal 311.

Figure 7A:
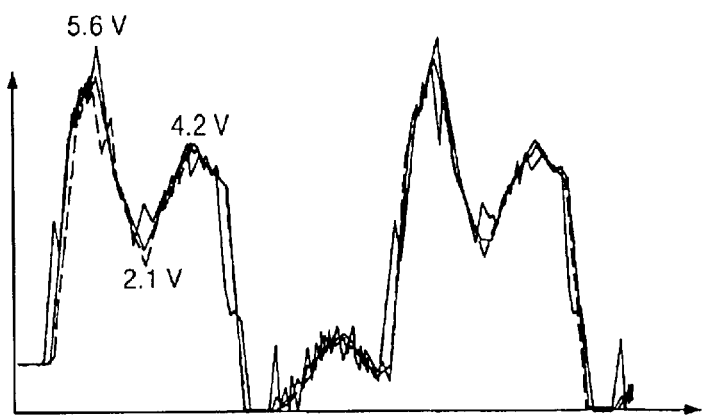
FIG. 7A is a timing diagram of a signal received by the conventional driver/receiver circuit of FIG. 1, the received signal exhibiting a primary overshoot to 5.6 volts, an intermediate decline to 2.1 volts, and a secondary overshoot to 4.2 volts.
Figure 7B:
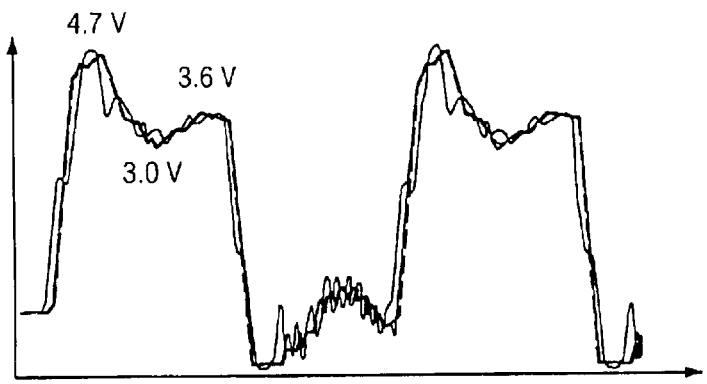
FIG. 7B is a timing diagram of a received signal that is clamped according to the principles of FIG. 2 et seq., the received signal exhibiting reduced overshoot and related characteristics that are improved over those of FIG. 7A.
Figure 7C:
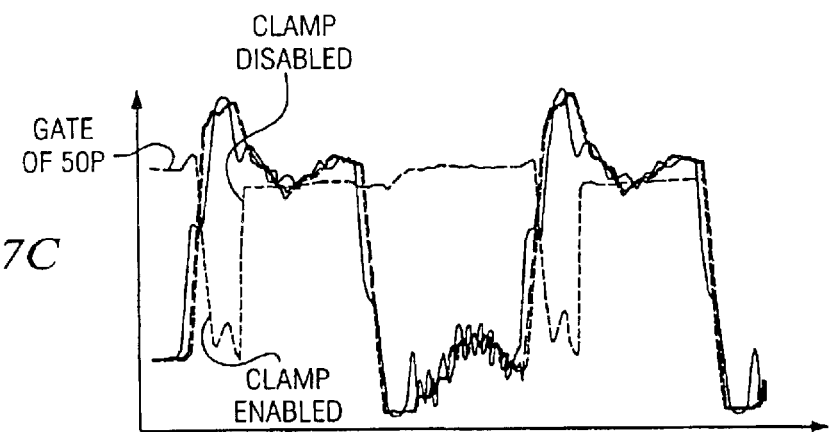
FIG. 7C is a timing diagram showing the waveform of FIG. 7B along with a signal that governs the time period during which the clamping function of dynamic clamp 200 (FIGS. 2, 3) is enabled.

Comparing Prior Art FIG. 7A to the waveforms in FIGS. 7B and 7C illustrates the advantages of clamping the overshoot in the manner described herein. Not only is the overshoot reduced (from 5.6 peak volts to 4.7 peak volts), but also the ensuing intermediate descent is reduced by half (5.6−2.1=3.5 volts for Prior Art FIG. 7A, but only 4.7−3.0= 1.7 volts for FIGS. 7B, 7C). Finally, the waveform in FIGS. 7B, 7C is manifestly "flatter," exhibiting a more rapid stable settling in a range about a desired steady state value. Accordingly, the waveform's characteristics are improved not only during the clamping period itself, but also afterwards.

Diode 58D and Schottky diode 59D are current blocking diodes for compensating backgate parasitics in MOSFETS 50P, 51P, 52P, 53P. The diodes connect VCC to the backgates of these MOSFETS. It is recognized that the diodes may also connect VCC to backgates of devices in other portions, such as the MOSFETS that may be present in inverter/buffer elements in deactivation delay 320.

Other elements are provided to ensure that the advantages of the strategic clamping of overshoot are not achieved at the expense of other circuit requirements, such as the overvoltage tolerance specification and the off current specification that were described in the foregoing "Background of the Invention."

During normal operation, when no overvoltage or $I_{off}$ conditions exist, MOSFETs 52P and 53P are in their non-conducting state and do not affect circuit operation.

However, when overvoltage or off conditions exist, the FIG. 5 circuit operates as follows.

During an over-voltage condition, the received signal on signal line 100 is ramped to a voltage above VCC, with VCC being non-zero. In this situation, MOSFETs 52P and 53P turn on, clamping the signal on signal line 100 to the gate and backgate of MOSFET 50P to ensure MOSFET 50P is off, thus preventing clamping diode 50D from clamping signal line 100 to VCC.

More specifically, the gate of MOSFET 50P is clamped through MOSFET 52P, and the backgates of MOSFETs 50P, 51P, 52P and 53P are clamped through MOSFET 53P. In an over-voltage condition, the voltage on signal line 100 (which exceeds VCC) is transferred through MOSFETs 52P and 53P to the gate of 50P and the above-mentioned backgates to ensure that MOSFET 50P stays off (non-conductive). In this manner, series-connected elements MOSFET 50P and diode 50D do not conduct current from the output line 100 to the supply voltage VCC.

When a DC over-voltage tolerance test is performed, MOSFET 51N is never turned on to override MOSFET 52P and 53P. During this test, the Clamp Disable signal 321 from deactivation delay 320 (FIG. 3) deactivates MOSFET 51N. Thus, when this test is performed, there MOSFET 51N is never activated and never overrides MOSFETs 52P, 53P as they keep MOSFET 50P on.

This operation during over-voltage conditions is distinguished from normal operating conditions in which signal 100 receives a transit signal (an AC signal with a certain non-zero frequency). During normal operating conditions, MOSFET 51N temporarily overrides MOSFETs 52P, 53P and enables MOSFET 50P and diode 50D to clamp signal line 100 until Clamp Disable signal 321 deactivates MOSFET 51N.

During an $I_{off}$ condition, the receiver is not powered VCC=0 volts). In this situation, MOSFETS 52P, 53P are on and ready to clamp any voltage on signal line 100 to the gate and backgate of MOSFET 50P. As the received signal on signal line 100 is ramped to a given high level, MOSFET 50P is turned off through the action of MOSFETs 52P, 53P, ensuring that diode 50D does not inadvertently clamp the signal on line 100 to VCC=0. MOSFETs 52P, 53P clamp signal line 100 to the gate of MOSFET 50P and the backgates of MOSFETS 50P, 51P, 52P and 53P, ensuring MOSFET 50P stays off (non-conductive) and does not conduct current from the signal line 100 to VCC.

It is recognized that tests for verifying over-voltage tolerance and off are DC tests, so that MOSFET 51N is never turned on to override MOSFETs 52P and 53P. In contrast, when signal line 100 receives an AC signal (that is, an input with non-zero frequency), MOSFET 51N temporarily overrides MOSFET 52P and 53P and enables clamping.

Figure 6:
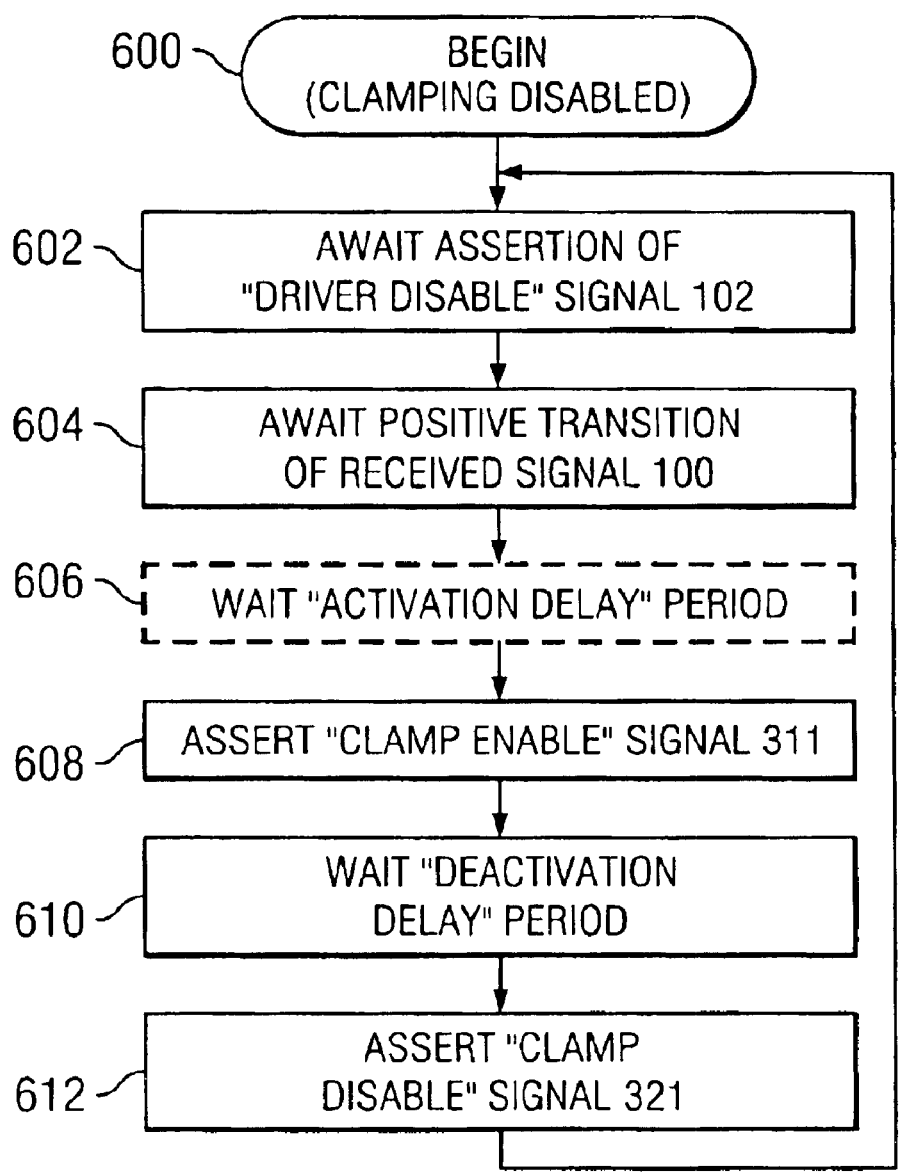
FIG. 6 is a flowchart illustrating an embodiment of a method of clamping a signal line during periods in which overshoot and related problems are likely encountered.

The circuits that are described above support methods of clamping a signal line during periods in which overshoot and related problems are likely encountered. One such method is shown in the flowchart of FIG. 6. It is recognized that the illustrated method may be performed by arrangements other than those described above.

Referring to FIG. 6, the method begins at block 600 which indicates that the clamping portion 330 (FIG. 3) is not enabled to clamp signal line 100.

Block 602 indicates awaiting assertion of the Driver Disable signal 102, and block 604 indicates awaiting a positive transition of the received signal on signal path 100.

Block 606 indicates an optional step of waiting for an activation delay period. In the FIG. 4 embodiment, this activation delay period is defined by the delay through inverters 412, 414 (the delay through any of MOSFETs 41P, 40P, 40N, 41N, 42N is considered incidental for purposes of this discussion). Block 606 is drawn in dashed lines to emphasize that this waiting period is optional; that is, the activation delay period may be zero. In other words, inverters 412, 414 may be omitted in certain applications if desired.

After any activation delay, block 608 indicates assertion of the Clamp Enable signal 311 that enables clamping portion 330 to clamp signal line 100. This clamping function is enabled for a deactivation delay period, as indicated by the wait in block 610. At the end of the deactivation delay period, the Clamp Disable signal 321 is asserted as indicated by block 612.

At this time, the clamping function is disabled, and control passes back to block 602, awaiting a subsequent assertion of a Driver Disable signal 102.

Also provided is a backplane-insertable card 130 that includes the dynamic receiver clamp described herein.

The foregoing description provides support for arrangements for dynamically clamping overshoot in a received signal on a signal line (100) while not clamping the received signal at times when the overshoot is not likely encountered. The arrangements may have an activation element (310) configured to assert a Clamp Enable signal (311) when overshoot is likely encountered in the received signal, a deactivation element (320) configured to assert a Clamp Disable signal (321) when overshoot is no longer likely encountered in the received signal, and a clamping portion (330) configured to clamp the received signal (100) beginning with the assertion of the Clamp Enable signal and ending with the assertion of the Clamp Disable signal.

The foregoing description also provides support for arrangements for dynamically clamping overshoot in a received signal on a signal line (100) while not clamping the received signal at times when the overshoot is not likely encountered. The arrangements may have an activation element (310) configured to assert a Clamp Enable signal (311) in response to a transition of the received signal, a deactivation element (320) configured to assert a Clamp Disable signal (321) after the Clamp Enable signal (311) is asserted, and a clamping portion (330) configured to clamp the received signal (100) beginning with the assertion of the Clamp Enable signal and ending with the assertion of the Clamp Disable signal.

The activation element (310) may be configured to assert the Clamp Enable signal (311) in response to the transition of the received signal that occurs during a period in which a Driver Disable signal (102) is asserted.

The deactivation element may include a deactivation delay (320) that is configured to assert a Clamp Disable signal (321) a predetermined deactivation delay period after the Clamp Enable signal (311) is asserted.

The Driver Disable signal (102) may be provided to the arrangement on a circuit card (130) that also includes an output driver (110) whose output is disabled by the Driver Disable signal to present a high-impedance state to the signal line (100) so that the output driver (110) does not affect the received signal on the signal line (100).

The activation element (310) may include stacked first and second pairs (41P/41N, 40P/40N) of metal oxide semiconductor field effect transistors (MOSFETs) that collectively perform a logical AND function on the Driver Disable signal (102) and the received signal on the signal line (100) to form the Clamp Enable signal (311), in which the first pair (41P, 41N) of MOSFETs is responsive to the Driver Disable signal and the second pair (40P, 40N) of MOSFETs is responsive to the received signal on the signal line.

The activation element (310) may further include an activation delay arrangement (412, 414) configured to delay an output of the first and second stacked pairs of MOSFETs so as to form the Clamp Enable signal (311).

The clamping portion (330) may include a diode (50D) and a switching element (50P) connected in series between a supply voltage (VCC) and the signal line (100); the switching element (50P) may be responsive to the Clamp Enable signal (311) to enable the diode (SOD) to clamp overshoot on the signal line (100); and the switching element (50P) may be responsive to the Clamp Disable signal (321) to disable the diode (50D) from clamping the signal line (100).

The clamping portion (330) may further include at least one switching element (52P and/or 53P) configured to ensure that the clamping portion (330) does not clamp the signal line (100) when a received signal on the signal line exceeds the supply voltage VCC (an over-voltage condition).

The clamping portion (330) may further include at least one switching element (52P and/or 53P) configured to ensure that the clamping portion (330) does not clamp the signal line (100) when the supply voltage VCC is zero (the $I_{off}$ condition).

The foregoing description also supports backplane-insertable circuit cards that include the above-described arrangements.

The foregoing description also supports methods of dynamically clamping overshoot in a received signal on a signal line (100) while not clamping the received signal at times when the overshoot is not likely encountered. The methods may include asserting a Clamp Enable signal (311) in response to a transition of the received signal, asserting a Clamp Disable signal (321) after the Clamp Enable signal (311) is asserted, and clamping the received signal (100) beginning with the assertion of the Clamp Enable signal and ending with the assertion of the Clamp Disable signal.

The step of asserting the Clamp Enable signal (311) may includes asserting the Clamp Enable signal (311) in response to a transition of the received signal that occurs during a period in which a Driver Disable signal (102) is asserted.

The step of asserting the Clamp Disable signal (321) may include asserting the Clamp Disable signal (321) a deactivation delay period after the Clamp Enable signal (311) is asserted.

The method may also include ensuring that the received signal (100) is not clamped to a supply voltage (VCC) when the received signal exceeds the voltage supply (VCC).

The method may also include ensuring that the received signal (100) is not clamped to a supply voltage (VCC) when the supply voltage (VCC) is zero.

Many alternatives, modifications, and variations will be apparent to those skilled in the art in light of the above teachings. For example, the choice of elements other than diodes or MOSFETs, or elements of different conductivity types, and the choice of different circuit components and configurations, lie within the scope of the present invention. Further, the design and adjustment of delay elements, to accommodate different signal frequencies and applications of the dynamic receiver clamp, lie within the contemplation of the invention. It is therefore to be understood that within the scope of the appended claims and their equivalents, the invention may be practiced otherwise than as specifically described herein.

What is claimed is:

1. An arrangement for dynamically clamping overshoot in a received signal on a signal line while not clamping the received signal at times when the overshoot is not likely encountered, the arrangement comprising:
   an activation element configured to assert a Clamp Enable signal in response to a transition of the received signal;
   a deactivation element configured to assert a Clamp Disable signal after the Clamp Enable signal is asserted; and
   a clamping portion configured to clamp the received signal beginning with the assertion of the Clamp Enable signal and ending with the assertion of the Clamp Disable signal wherein:
   the activation element is configured to assert the Clamp Enable signal in response to the transition of the received signal that occurs during a period in which a Driver Disable signal is asserted.

2. The arrangement of claim 1, wherein:
   the deactivation element includes a deactivation delay that is configured to assert a Clamp Disable signal a predetermined deactivation delay period after the Clamp Enable signal is asserted.

3. A backplane-insertable circuit card that includes the arrangement of claim 1.

4. The arrangement of claim 2, wherein:
   Driver Disable signal is provided to the arrangement on a circuit card that also includes an output driver whose output is disabled by the Driver Disable signal to present a high-impedance state to the signal line so that the output driver does not affect the received signal on the signal line.

5. A backplane-insertable circuit card that includes the arrangement of claim 2.

6. The arrangement of claim 4, wherein:
   the clamping portion includes a diode and a switching element connected in series between a voltage supply and the signal line;
   the switching element is responsive to the Clamp Enable signal to enable the diode to clamp overshoot on the signal line; and
   the switching element is responsive to the Clamp Disable signal to disable the diode from clamping the signal line.

7. The arrangement of claim 4, wherein the activation element includes stacked first and second pairs of metal oxide semiconductor field effect transistors (MOSFETs) that collectively perform a logical AND function on the Driver Disable signal and the received signal on the signal line to form the Clamp Enable signal, wherein:
   the first pair of MOSFETs is responsive to the Driver Disable signal; and
   the second pair of MOSFETs is responsive to the received signal on the signal line.

8. A backplane-insertable circuit card that includes the arrangement of claim 4.

9. The arrangement of claim 6, wherein the clamping portion further includes:
   at least one switching element configured to ensure that the clamping portion does not clamp the signal line when a received signal on the signal line exceeds the voltage supply.

10. The arrangement of claim 6, wherein the clamping portion further includes:
    at least one switching element configured to ensure that the clamping portion does not clamp the signal line when the voltage supply is zero.

11. The arrangement of claim 7, wherein the activation element further includes:
    an activation delay arrangement configured to delay an output of the first and second stacked pairs of MOSFETs so as to form the Clamp Enable signal.

12. A backplane-insertable circuit card that includes the arrangement of claim 7.

13. A backplane-insertable circuit card that includes the arrangement of claim 11.

14. A backplane-insertable circuit card that includes the arrangement of claim 6.

15. A backplane-insertable circuit card that includes the arrangement of claim 9.

16. A backplane-insertable circuit card that includes the arrangement of claim 10.

17. A method of dynamically clamping overshoot in a received signal on a signal line while not clamping the received signal at times when the overshoot is not likely encountered, the arrangement comprising:
    asserting a Clamp Enable signal in response to a transition of the received signal;

asserting a Clamp Disable signal after the Clamp Enable signal is asserted; and clamping the received signal beginning with the assertion of the Clamp Enable signal and ending with the assertion of the Clamp Disable signal, wherein the step of asserting the Clamp Enable signal includes:

asserting the Clamp Enable signal in response to a transition of the received signal that occurs during a period in which a Driver Disable signal is asserted.

18. The method of claim 17, wherein the step of asserting the Clamp Disable signal includes:

asserting the Clamp Disable signal a deactivation delay period after the Clamp Enable signal is asserted.

19. The method of claim 18, further comprising:

ensuring that the received signal is not clamped when a voltage supply is zero.

20. The method of claim 18, further comprising:

ensuring that the received signal is not clamped when the received signal exceeds a non-zero voltage supply.

* * * * *